United States Patent
Kolthammer et al.

(10) Patent No.: US 10,223,480 B2
(45) Date of Patent: Mar. 5, 2019

(54) METHOD FOR MODELING AND ACCOUNTING FOR CASCADE GAMMAS IN IMAGES

(71) Applicants: KONINKLIJKE PHILIPS N.V., Eindhoven (NL); UNIVERSITY HOSPITALS MEDICAL GROUP, INC., Cleveland, OH (US); CASE WESTERN RESERVE UNVERSITY, Cleveland, OH (US)

(72) Inventors: Jeffrey Allan Kolthammer, Cleveland Heights, OH (US); Raymond Frank Muzic, Mentor, OH (US); Jinghan Ye, Cupertino, CA (US)

(73) Assignees: KONINKLIJKE PHILIPS N.V., Eindhoven (NL); CASE WESTERN RESERVE UNIVERSITY, Cleveland, OH (US); UNIVERSITY HOSPITALS MEDICAL GROUP, INC., Cleveland, OH (US)

( * ) Notice: Subject to any disclaimer, the term of this patent is extended or adjusted under 35 U.S.C. 154(b) by 734 days.

(21) Appl. No.: 14/783,041

(22) PCT Filed: Apr. 10, 2014

(86) PCT No.: PCT/IB2014/060612
§ 371 (c)(1),
(2) Date: Oct. 7, 2015

(87) PCT Pub. No.: WO2014/167522
PCT Pub. Date: Oct. 16, 2014

(65) Prior Publication Data
US 2016/0048615 A1  Feb. 18, 2016

Related U.S. Application Data

(60) Provisional application No. 61/810,917, filed on Apr. 11, 2013.

(51) Int. Cl.
*G06F 17/50* (2006.01)
*G01T 1/164* (2006.01)
(Continued)

(52) U.S. Cl.
CPC ........ *G06F 17/5009* (2013.01); *G01T 1/1647* (2013.01); *G01T 1/2985* (2013.01); *G06F 17/18* (2013.01); *G06T 11/005* (2013.01)

(58) Field of Classification Search
CPC ... G06F 17/5009; G06F 17/18; G01T 1/2985; G01T 1/1647
(Continued)

(56) References Cited

U.S. PATENT DOCUMENTS 6,256,367 B1   7/2001  Vartanian
7,894,652 B2   2/2011  Hayden et al.
(Continued)

FOREIGN PATENT DOCUMENTS

WO   2013175352 A1   11/2013

OTHER PUBLICATIONS

Zhu et al. "Monte Carlo Modeling of Cascade Gamma Rays in PET". 2006 IEEE Nuclear Science Symposium Conference Record. p. 3522-3525.*
(Continued)

*Primary Examiner* — Eunhee Kim

(57) ABSTRACT

An imaging method and corresponding system (10) account for cascade gammas. Event data describing detected gamma rays emitted from a target volume of a subject are received. The detected gamma rays include cascade gammas emitted from a radionuclide within the target volume. Cascade and annihilation gamma emissions from the target volume and coincidence detection of the imaging system (10) are simulated using a Monte Carlo (MC) simulation technique to generate a cascade dataset comprised of annihilation coin-
(Continued)

Figure 1:
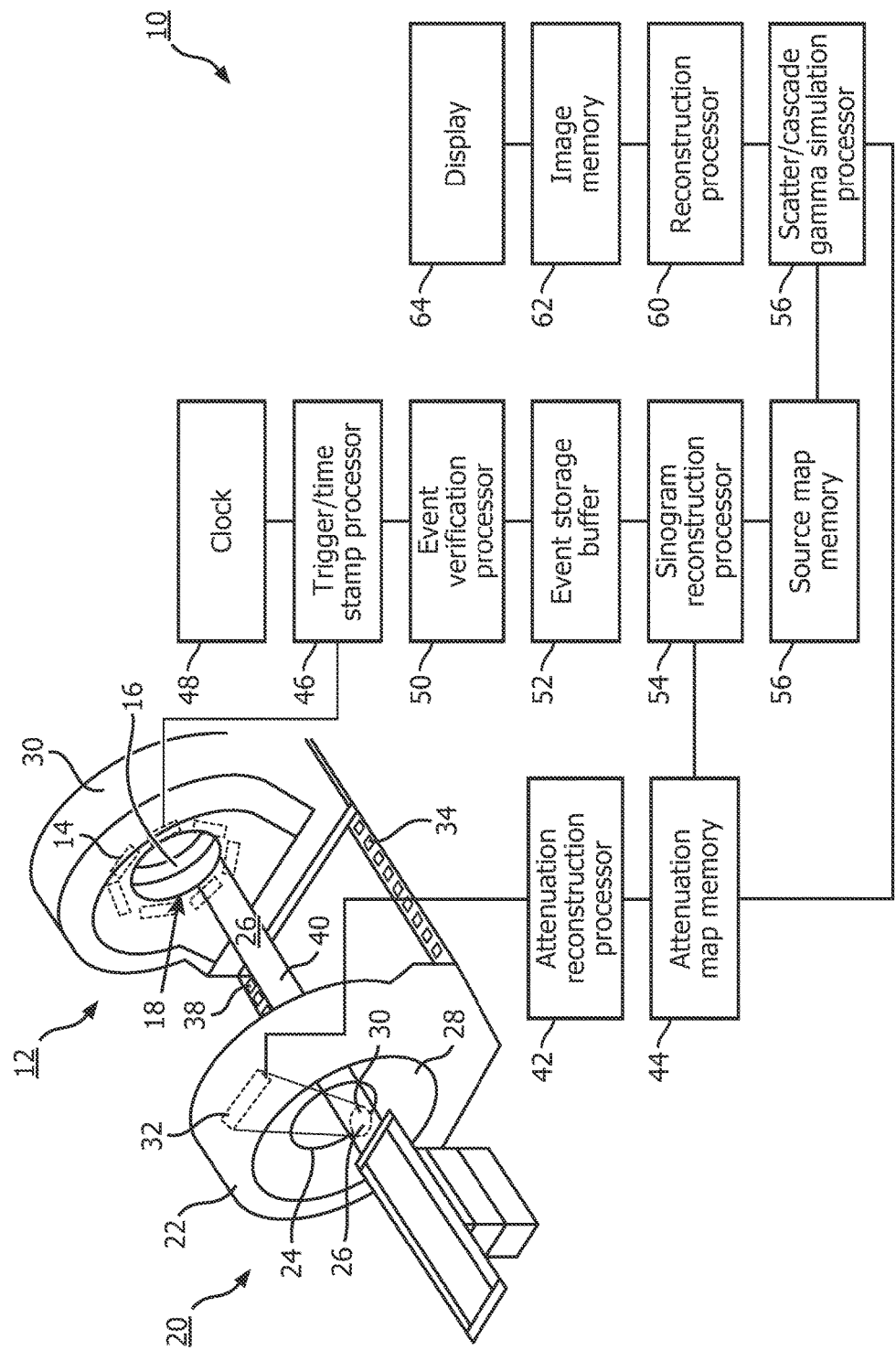

cidence events and cascade coincidence events. The event data is reconstructed into an image representation of the target volume with correction of cascade coincidence using the relationship between the annihilation coincidence events and the cascade coincidence events in the cascade data set.

17 Claims, 2 Drawing Sheets

(51) Int. Cl.
    *G01T 1/29*     (2006.01)
    *G06T 11/00*     (2006.01)
    *G06F 17/18*     (2006.01)

(58) Field of Classification Search
    USPC .............................................. 703/2; 600/410
    See application file for complete search history.

(56) References Cited

U.S. PATENT DOCUMENTS

2012/0288176 A1* 11/2012 Ye .................. G06T 11/005
                                                        382/131
2015/0093004 A1     4/2015 Ye

OTHER PUBLICATIONS

Acorsi, R., et al.; Optimization of a fully 3D single scatter simulation algorithm for 3D PET; 2004; Phys. Med. Biol.; 49:2577-2598.
Esteves, F. P., et al.; Novel solid-state-detector dedicated cardiac camera for fast myocardial perfusion imaging: multicenter comparison with standard dual detector cameras; 2009; Journal of Nuclear Cardiology; 16:9137.
Holdsworth, C. H., et al.; Evaluation of a Monte Carlo Scatter Correction in Clinical 3D PET; 2003; Nuclear Science Symposium Conference Record; IEEE; vol. 4; pp. 2540-2544.
Laforest, R., et al.; Cascade removal and microPET imaging with 76Br; 2009; Phys. Med. Biol.; 54:1503-1531.
Vandenberghe, S.; Three-dimensional positron emission tomography imaging with 124I and 86Y; 2006; Nuclear Medicine Communications; 27:237-245.
Tang, J., et al.; Optimization of Rb-82 PET acquisition and reconstruction protocols for myocardial perfusion defect detection; 2009; Phys. Med. Biol.; 54:3161-3171.
Watson, C. C.; New, Faster, Image-Based Scatter Correction for 3D PET; 2000; IEEE Trans. on Nuclear Science; 47 (4)1587-1594.
Watson, C., et al.; Prompt gamma correction for improved quantification in 82Rb PET; 2008; J. Nucl. Med.; 49(Supplement 1)p. 64.

* cited by examiner

METHOD FOR MODELING AND ACCOUNTING FOR CASCADE GAMMAS IN IMAGES

CROSS REFERENCE TO RELATED APPLICATIONS

This application is a national filing of PCT application Serial No. PCT/IB2014/060612, filed Apr. 10, 2014, published as WO 2014/167522 A1 on Oct. 16, 2014, which claims the benefit of U.S. provisional application Ser. No. 61/810,917 filed Apr. 11, 2013, which is incorporated herein by reference.

The present application relates generally to positron emission tomography (PET). It finds particular application in conjunction with PET acquisition, and will be described with particular reference thereto. However, it is to be understood that it also finds application in other usage scenarios and is not necessarily limited to the aforementioned application.

Certain positron emitting radionuclides emit gamma rays (also known as "gammas") in addition to positrons in their decays. These additional gammas are known as cascade gammas or prompt gammas. Such radionuclides include, for example, rubidium 82 ($^{82}$Rb), iodine 124 ($^{124}$I) and yttrium 86 ($^{86}$Y). Cascade gamma(s) are emitted nearly simultaneously with positrons, which make them difficult to separate from the desired annihilation pairs.

Cascade gamma(s) lead to contamination of acquired PET data, which leads to degradation in the quality and quantitative accuracy of the resulting PET image. This is regardless of Compton scatter. Hence, the correction for cascade gamma emission is important, especially in applications in which quantitative accuracy is required. One application in which this correction is particularly important is in quantitative, dynamic $^{82}$Rb-PET imaging of the heart, because quantitative accuracy is paramount to the procedure.

Several methods exist to perform correction for scattered events in PET. One such method is single-scatter simulation (SSS). A challenge with SSS simulation is that when a patient is larger, multiple scattering may contribute to large portion of all the scattered events and reduce the accuracy. Further, the fraction of the field of view not occupied by the patient and available for estimating contamination becomes quite limited. Nonetheless, it has been shown through Monte Carlo (MC) simulations that the overall shape of scatter contribution does not change significantly with the addition of multiple scatters. Therefore, the SSS can be scaled to compensate for the contribution from multiple scattering.

A typical method to estimate the scaling factor for SSS is fitting the "tail" part of a SSS sinogram to the measured sinogram, where tail refers to the portion in the sinogram corresponding to the outside of the imaged object. In this method, it is assumed that the tail part in the measured data includes only contributions from scattered events. This assumption is valid for smaller patients when the tail is available and includes enough counts in it. However, when scanning a larger patient, the tail part decreases in size or disappears (truncated). In the case of the tail part being a smaller size or disappearing, fitting the tail can have significant error.

Another method to perform correction for scattered events in PET is to perform a full MC simulation to produce shapes of both primary and scatter contributions. However, this approach demands a significant amount of computations and therefore is too slow for commercial PET imaging. Yet another method to perform correction for scattered events in PET is to use MC based scatter simulation for scaling and SSS to predict the distribution shape.

A challenge with the foregoing methods to scatter correction is that they do not account for cascade gammas. Hayden et al. [U.S. Pat. No. 7,894,652] describes a method by which a distribution approximating that of cascade gamma contamination is corrected along with PET scatter, in an SSS-based method. In related work, Watson et al. [J Nucl Med. 2008; 49 (Supplement 1):p64] describes the method as being derived from random correction distribution. Esteves et al. [J Nucl Cardiol. 2010; 17(2):p247] applied the same method to human data and demonstrated that improved images result.

The present application provides a new and improved system and method which overcome the above-referenced problems and others.

In accordance with one aspect, an imaging system accounting for cascade gammas is provided. The imaging system includes at least one processor programmed to receive event data describing detected gamma rays emitted from a target volume of a subject. The detected gamma rays include cascade gammas emitted from a radionuclide within the target volume. The at least one processor is further programmed to simulate cascade and annihilation gamma emissions from the target volume and coincidence detection of the imaging system (10) using a Monte Carlo (MC) simulation technique to generate a cascade dataset comprised of annihilation coincidence events and cascade coincidence events. Even more, the at least one processor is further programmed to reconstruct the event data into an image representation of the target volume with correction of cascade coincidence using the relationship between the annihilation coincidence events and the cascade coincidence events in the cascade data set.

In accordance with another aspect, an imaging method accounting for cascade gammas is provided. Event data describing detected gamma rays emitted from a target volume of a subject are received. The detected gamma rays include cascade gammas emitted from a radionuclide within the target volume. Cascade and annihilation gamma emissions from the target volume and coincidence detection of the imaging system are simulated using a Monte Carlo (MC) simulation technique to generate a cascade dataset comprised of annihilation coincidence events and cascade coincidence events. The event data is reconstructed into an image representation of the target volume with correction of cascade coincidence using the relationship between the annihilation coincidence events and the cascade coincidence events in the cascade data set.

In accordance with another aspect, an imaging system accounting for cascade gammas is provided. The imaging system includes a simulation processor configured to simulate cascade and annihilation gamma emissions from a target volume of a subject and coincidence detection of the imaging system using a Monte Carlo (MC) simulation technique to generate a cascade dataset comprised of annihilation coincidence events and cascade coincidence events. The simulation processor is further configured to simulate scatter of annihilation gammas in the target volume to generate a scatter dataset comprised of primary coincidence events and scattered coincidence events. Even more, the simulation processor is further configured to combine the scatter dataset and the cascade dataset to create a correction dataset. The imaging system further includes a reconstruction processor configured to reconstruct the event data into an image representation of the target volume using the correction dataset for correction of cascade gammas and scatter in the event data.

One advantage resides in improved quality in PET images.

Another advantage resides in improved quantitative accuracy in PET images.

Another advantage resides in faster reconstruction when compared to reconstruction with cascade gamma correction using full Monte Carlo (MC) simulation.

Another advantage resides in improved rubidium 82 ($^{82}$Rb) imaging of the heart.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 1 illustrates a positron emission tomography (PET) system correcting for cascade gammas.

Figure 2:
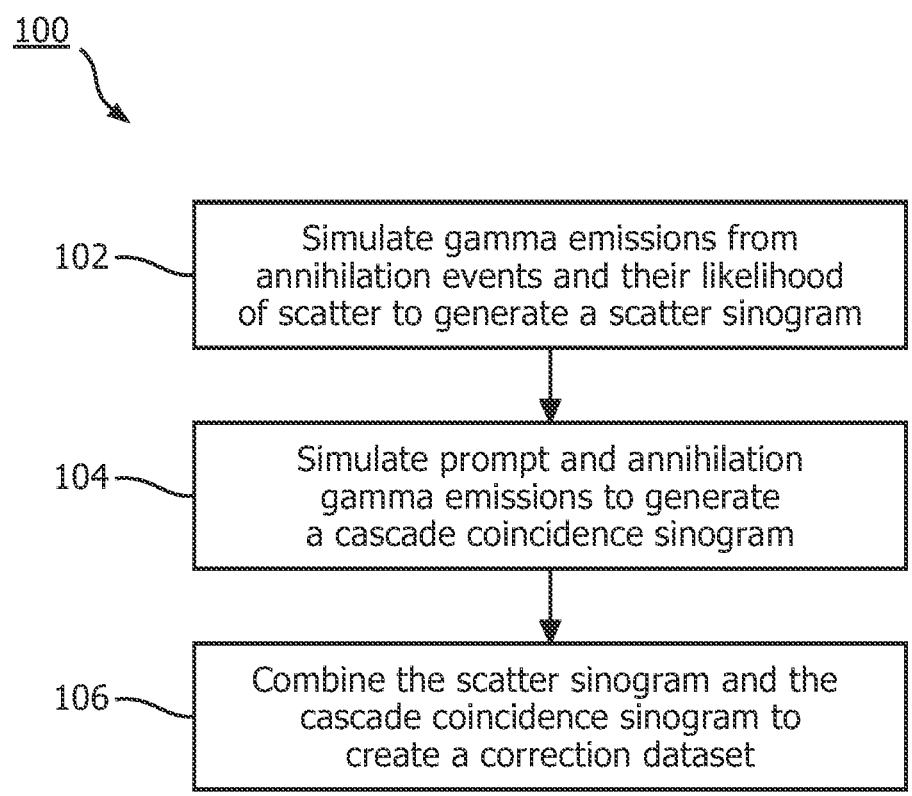

FIG. 2 illustrates a method for determining the distribution of primary, cascade gamma and scattered coincidence events The present invention uses a Monte Carlo (MC) simulation-based technique to predict the propensity of cascade gamma rays (also known as prompt gammas) in positron emission tomography (PET) data to account for cascade gammas during image reconstruction and improve the accuracy of the resulting image. Cascade gammas are gamma rays (also known as "gammas") emitted, in addition to positrons, by certain radionuclides (e.g., rubidium 82 ($^{82}$Rb), iodine 124 ($^{124}$I) and yttrium 86 ($^{86}$Y)) during their decays. Because MC simulation-based techniques can also be used for single-scatter simulation and correction, this cascade gamma correction could be incorporated into a single-scatter simulation and correction algorithm.

With reference to FIG. 1, a multi-modality imaging system 10 includes a PET scanner 12 to generate raw PET data using radionuclides emitting cascade gammas. Such radionuclides can include, for example, $^{82}$Rb, $^{124}$I and/or $^{86}$Y. The PET scanner 12 includes detectors 14 arranged around a bore 16 of the PET scanner 12. The bore 16 defines an examination region 18. The detectors 14 are typically arranged in a stationery ring. However, rotatable heads are also contemplated.

The system 10 further includes a computed tomography (CT) scanner 20 to generate radiation attenuated data. The CT scanner 20 includes a non-rotating gantry 22 and a rotating gantry 24 upon which an x-ray tube 26 of the CT scanner 20 is mounted. A bore 28 of the CT scanner 20 defines an examination region 30 of the CT scanner 20. An array of radiation detectors 32 is mounted on the rotating gantry 24 to receive radiation from the x-ray tube 26 after the x-rays transverse the examination region 30. Alternatively, the array of detectors 32 can be positioned on the non-rotating gantry 22.

The PET scanner 12 can be mounted on tracks 34 to facilitate patient access. The tracks 34 extend in parallel to a longitudinal axis of a subject support or couch 36, thus enabling the CT scanner 20 and the PET scanner 12 to form a closed system. A motor and drive 38 is provided to move the PET scanner 12 in and out of the closed position. A motor and drive 40 or the like provides longitudinal movement and vertical adjustment of the subject support 36 in the examination regions 18, 30. Mounted CT and PET scanners in a single, shared closed system with a common examination region are also contemplated.

The subject support 36, which carries a subject, is moved into the examination region 30 of the CT scanner 20. The CT scanner 20 generates radiation attenuated data for a target volume of the subject, which is then used by an attenuation reconstruction processor 42 to reconstruct the radiation attenuated data into an attenuation map that is stored in an attenuation map memory 44. The radiation attenuated data typically includes all data in geography that can contribute to strike events detected by the detectors 14 of the PET scanner 12 in the target volume (i.e., including data outside the field of view (FOV) for a three-dimensional (3D) scanner). Alternatively, a magnetic resonance (MR) scanner or other type of scanner can be used in place of the CT scanner 20 to generate the attenuation map.

The patient support 36 moves the subject into the PET scanner 12 in a position that is geometrically and mechanically predicated as being the same as the imaged position in the examination region 30 of the CT scanner 20. Before the PET scan commences, a subject is injected with a radionuclide which emits positrons, as well as cascade gammas. The radionuclide can include, for example, $^{82}$Rb, $^{124}$I and/or $^{86}$Y.

In PET scanning, the PET scanner 12 is used to generate emission data for the target volume describing gammas detected by the detectors 14 of the PET scanner 12. The emission data typically includes all data in geography of detected events (i.e., detected depositions of energy by gammas in the detectors 14) that can contribute to gammas detected by the detectors 14 of the PET scanner 12 in the target volume (i.e., including data outside the field of view (FOV) for a three-dimensional (3D) scanner). This is important because a gamma can trigger multiple events in the case of Compton scatter.

A triggering processor 46 monitors each of the detectors 14 for an energy spike (e.g., integrated area under the pulse) to generate the emission data. A pair of annihilation gammas is produced by a positron annihilation event in the examination region 18, where each annihilation gamma of the pair travels in approximately opposite directions. Further, cascade gammas are emitted by the radionuclide at nearly the same time. When a gamma deposits energy in the detectors 14, the triggering processor 46 triggers 46. Upon triggering, the triggering processor 46 checks a clock 48 and time stamps the event with a time of leading edge receipt. Further, the triggering processor 46 records an estimate of the location where the event occurred on the detectors 14 and an estimate of the energy of the event. The emission data typically includes time stamps, energy estimates and location estimates of triggered events.

The emission data are used by an event verification processor 50 to determine and verify coincident events. A coincident event corresponds to the detection of a pair of gammas within a specified time difference of each other, the specified time difference small enough to ensure the gammas are from the same annihilation event. A coincident event preferably only includes annihilation gammas. However, cascade gammas appear similar to annihilation gammas. Hence, a coincident event can include cascade gammas. The emission data can also be used by the event verification processor 50 to determine and verify delayed coincident events. A delayed coincident event corresponds to the detection of a gamma within a predetermined time window that is a specified time after another gamma, the specified time sufficiently large to ensure the gammas are from different annihilation events.

Verified coincident events and verified delayed coincident events typically include only gammas falling within a predetermined energy window (e.g., approximately 511 keV). Verified coincident events define lines of response (LORs). Once a coincident event is verified by the event verification processor 50, the LOR is passed to an event storage buffer 52 with the time stamps of the gammas and stored in a list in the event storage buffer 52 as event data (i.e., as list-mode data). Verified delayed coincident events can also be stored in the event storage buffer 52 as part of the event data.

A sinogram reconstruction processor 54 reconstructs the verified pairs into an image representation of the subject. In one embodiment, the sinogram reconstruction processor 54 converts the verified pairs into measured sinograms and accesses the attenuation data stored in the attenuation map memory 44 and reconstructs the measured sinograms into an attenuation corrected source distribution map. Other approaches for representing the verified pairs, besides sinograms, are also contemplated. The attenuation corrected source distribution map is stored in a source map memory 56. It is also contemplated that other reconstruction algorithms may be used, including algorithms operating directly with the list-mode data, such as list-mode ordered subsets expectation maximization (OSEM) and list-mode reconstruction with time-of-flight (TOF) reconstruction.

The measured event data (after random correction) includes primary, cascade, and scattered coincidence events. A primary coincidence event includes only unscattered gammas from an annihilation event. A cascade coincidence event includes a cascade gamma. A scattered coincidence event includes a scattered gamma from an annihilation event and a scattered or unscattered gamma from the annihilation event. The measured event data can also include random coincidence events. Random-correction is a statistical method. Approximately the correct number of random events is removed, but individual random events are not identified. A simulation processor 58 utilizes the source distribution map and the attenuation map to determine the distribution of primary, cascade and scattered coincidence events for scatter and cascade correction of the event data. Typically, the simulation processor 58 does so in accordance with the method 100 of FIG. 2.

With reference to FIG. 2, gamma emissions from annihilation events and their probability of scatter are simulated 102 to generate scatter sinograms representing an estimate of scatter contribution to the measured event data. This can be performed using a method to model the shape of the scatter sinograms (e.g., single-scatter simulation (SSS)), MC simulation, or a combination of the two. As discussed above, using a method modeling shape alone poses challenges with scaling, especially for larger patients, since tail fitting is typically employed for scaling. Further, using MC alone poses challenges with computation time. Hence, a combination of a method modeling shape and MC is preferably used.

Where a method modeling shape is used in combination with MC, the method modeling shape models single scattering of annihilation gammas from the source distribution and the corresponding attenuation map to generate a sinogram representing the shape of the scatter sinograms. A scale factor is then determined for each of the measured sinograms with MC simulation using the source distribution and the corresponding attenuation map. The scale factor can be specific to a portion of the measured sinograms or global across all the measured sinograms (i.e., shared across all the measured sinograms).

In the MC simulation, combinations of annihilation gammas are generated according to the source distribution. The trajectory of each gamma is traced using the attenuation map until the gamma escapes from the imaged object. The escaped gamma may deposit energy in the detectors 14, thereby causing detection. A coincidence event is registered if a pair of gammas is detected within a specified time difference of each other. The event is labeled as primary if neither of the gammas encountered scattering. The event is labeled as scattered if one or both of the gammas encountered Compton scattering in the attenuation medium.

A scatter fraction can be represented as the ratio of total detected scattered coincidence events S and total detected coincidence events T (i.e., S/T) from MC simulation. The scatter fraction changes with number of decays simulated and eventually stabilizes to a certain value $r_{sc}$. The scatter fraction obtained from the MC simulation is a good approximation of the actual scatter fraction in the measured coincidence events.

A scaling factor for a specific one of the measured sinograms is then obtained by the following formula:

$$k = r_{sc} * \frac{T_{measured}}{T_{sim}}, \qquad (1)$$

where $T_{measured}$ is the total counts in the measured sinogram and $T_{sim}$ is the total counts in the sinogram generated by the method modeling shape. Alternatively, a scaling factor global across all the measured sinograms is obtained as described in Equation (1), except $T_{measured}$ is the average total counts in the measured sinogram. The sinogram generated by the method modeling shape is scaled by k to produce an estimated scatter sinogram for the measured sinogram.

In addition to determining the scatter sinograms, cascade and annihilation gamma emissions are simulated 104 using known data regarding the decay properties of the radionuclides to generate cascade sinograms representing an estimate of cascade contribution to the measured event data. This can be performed using a method to model the shape of the cascade coincidence sinograms (e.g., single-scatter simulation (SSS)), MC, or a combination of the two. As discussed above, using a method modeling shape alone poses challenges with scaling, especially for larger patients, since tail fitting is typically employed for scaling. Further, using MC alone poses challenges with computation time. Hence, a combination of a method modeling shape and MC is preferably used.

Despite limitations on computation power, it may be practical to use MC alone to fully generate the estimated cascade gamma sinogram. In the MC simulation, combinations of cascade and annihilation gammas are generated according to the source distribution and decay property of the radionuclide. The annihilation gammas have nearly opposite initial directions, while each of the cascade gamma(s) has a random initial direction unrelated to the annihilation gammas. The trajectory of each gamma is traced using the corresponding attenuation map until the gamma escapes from the imaged object. The escaped gamma may deposit energy in the detectors 14, thereby causing detection. A coincidence event is registered if a gamma is detected within a certain time after another gamma. The event is labeled as cascade if either of the gammas is a cascade gamma. The event is labeled as annihilation if both of the gammas are annihilation gammas.

Based on the detected, labeled coincidence events, estimated cascade coincidence sinograms corresponding to the measured sinograms are generated.

As an alternative to using MC alone to generate the estimated cascade coincidence sinograms, a method modeling shape is used in combination with MC. Namely, the method modeling shape is used to estimate the shape of the cascade coincidence sinograms and MC is used to estimate the magnitudes of the cascade coincidence sinograms. The effects of cascade coincidence events can, for example, be taken in to account in both the method modeling shape and MC, or just in MC.

Where the effects of cascade coincidence events are only taken into account in MC, the method modeling shape simulates single scattering of annihilation gammas from the source distribution and the corresponding attenuation map to generate a sinogram representing the shape of the cascade coincidence sinograms. As should be appreciated, the sinogram representing the shape of the cascade coincidence sinograms can be the same as the sinogram representing the shape of the scatter sinograms.

Where the effects of cascade gammas are taken into account in the method modeling shape, any method modeling the shape of the cascade coincidence sinograms and which takes into account cascade gammas can be employed to generate the sinogram. In that regard, the method modeling shape can produce the shape of the cascade coincidence sinograms by simulating cascade coincidence events or both cascade coincidence events and annihilation coincidence events. For example, the method of Hayden et al. [U.S. Pat. No. 7,894,652] can be used to generate the shape of the cascade coincidence sinograms. The method of Hayden et al. describes an SSS-based method by which a distribution approximating that of cascade gamma contamination is corrected along with PET scatter.

As an alternative to the foregoing methods modeling shape, the distribution of delayed coincidence events in the measured event data can be employed to generate the shape of the cascade coincidence sinograms. Namely, the sinogram can be generated from the delayed coincidence events in the measured event data.

After determining the sinogram of the method modeling shape, a scale factor is determined for each of the measured sinograms with MC simulation using the source distribution and the corresponding attenuation map. The scale factor can be specific to the measured sinograms or global across all the measured sinograms (i.e., shared across all the measured sinograms).

As above, in the MC simulation, combinations of cascade and annihilation gammas are generated according to the source distribution and decay property of the radionuclide. The annihilation gammas have nearly opposite initial directions, while the cascade gamma(s) have random initial directions unrelated to the annihilation gammas. The trajectory of each gamma is traced using the corresponding attenuation map until the gamma escapes from the imaged object. The escaped gamma may deposit energy in the detectors 14, thereby causing detection. A coincidence event is registered if a gamma is detected within a certain time after another gamma. The event is labeled as cascade if either of the gammas is a cascade gamma. The event is labeled as annihilation if both of the gammas are annihilation gammas.

A cascade coincidence fraction can be represented as the ratio of total detected cascade coincidence events G and total detected coincidence events $T$ (i.e., $\frac{G}{T}$), from MC simulation using the source distribution and the attenuation map. The cascade coincidence fraction changes with the number of pairs of gammas traced and eventually stabilizes to a certain value $r_{cc}$. The cascade coincidence fraction obtained from the MC simulation is a good approximation of the actual cascade coincidence fraction in the measured coincidence events.

A scaling factor for a specific one of the measured sinograms is then obtained by the following formula:

$$k = r_{cc} * \frac{T_{measured}}{T_{sim}}, \qquad (2)$$

where $T_{measured}$ is the total counts in the measured sinogram and $T_{sim}$ is the total counts in the sinogram generated by the method modeling shape, or approximated from a measurement of, for example, the number of delayed coincidence events in the measured data. Alternatively, a scaling factor global across all the measured sinograms is obtained as described in Equation (2), except $T_{measured}$ is the average total counts in the measured sinogram. The modeled cascade coincidence sinogram is scaled by k to produce an estimated cascade coincidence sinogram for the measured sinogram.

After determining the estimated scatter sinograms and the estimated cascade coincidence sinograms, the two simulated distributions defined by the estimated scatter sinograms and the estimated cascade coincidence sinograms, respectively, are combined 106 to form a correction dataset, which can be a sinogram, an image or in some other domain. The correction dataset can be applied to the measured event data for cascade gamma and scatter correction. This application can be before image reconstruction or during image reconstruction.

In some embodiments, the method 100 of FIG. 2 can be iteratively performed one or more times (e.g., performed once or performed multiple times), where the correction dataset is applied to the event data after each iteration. Typically, the method 100 is performed multiple times to approach the optimal solution because the initial event data is not scatter corrected. Hence, the initial event data can be corrected for attenuation, cascade gamma and scatter, as described above. The corrected data can then be used in lieu of the initial event data and corrected for attenuation, cascade gammas and scatter, as described above. This can be repeated multiple times.

Referring back to FIG. 1, a reconstruction processor 60 reconstructs the event pairs into a final reconstructed image with attenuation, cascade gamma and scatter correction. The reconstruction processor 60 can operate on event data that is pre-corrected for cascade gamma events and scatter events. Alternatively, the reconstruction processor 60 can apply the correction dataset to the event data by incorporating the correction dataset in the system matrix during reconstruction. The final reconstructed image is stored in an image memory 62 and displayed for a user on a display device 64, printed, saved for later use, and the like. In addition to, or as an alternative to reconstructing the image, regional time-activity curves for further analysis and the like can be generated.

The attenuation, cascade and scatter corrected data finds particular application estimating absolute myocardial blood flow from $^{82}$Rb PET data. Further, attenuation, cascade and scatter corrected data finds particular application to existing protocols for qualitative myocardial perfusion imaging.

Each of the triggering processor 46, the event verification processor 50, the attenuation reconstruction processor 42, the sinogram reconstruction processor 54, the scatter/cascade gamma simulation processor 58 and the reconstruction processor 60 is a software controlled device configured to execute software for performing the operations described above. The software controlled device can include one or more of a microprocessor, a microcontroller, a graphic processing unit (GPU), an application-specific integrated circuit (ASIC), a field-programmable gate array (FPGA), and the like. Typically, the software is carried on a memory, such as one or more of: a magnetic disk or other magnetic storage medium; an optical disk or other optical storage medium; a random access memory (RAM), read-only memory (ROM), or other electronic memory device or chip or set of operatively interconnected chips; and the like.

While the approach to cascade gamma correction was directed to PET data, it can also be applied to data generated using other nuclear imaging modalities, such as single-photon emission computed tomography (SPECT). In that regard, the PET scanner 12 can alternatively be a SPECT scanner. For a SPECT scanner, the detectors 14 are typically incorporated into individual heads, which are mounted for rotational and radial movement relative to the patient. Further, while the multi-modality system 10 used CT to generate an attenuation map, other imaging modalities can be employed. For example, the CT scanner 20 can be replaced with an MR scanner. Even more, while sinograms were used above to, for example, represent scatter and cascade gamma contributions, the sinograms can be replaced with other approaches to representing the data, such as LOR-grams or datasets in which events are back projected one at a time without constructing a sinogram.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A nuclear imaging system accounting for cascade gammas, said nuclear imaging system comprising:
    at least one processor programmed to:
        receive event data describing detected gamma rays emitted from a target volume of a subject, the detected gamma rays including cascade gammas emitted from a radionuclide within the target volume;
        simulate scatter of annihilation gammas in the target volume to generate a scatter dataset comprised of primary coincidence events and scattered coincidence events to determine a relationship between the primary coincidence events and the scattered coincidence events in the scatter dataset;
        simulate cascade and annihilation gamma emissions from the target volume and coincidence detection of the nuclear imaging system using a Monte Carlo (MC) simulation technique to generate a cascade dataset comprised of annihilation coincidence events and cascade coincidence events to determine a relationship between the annihilation coincidence events and the cascade coincidence events in the cascade data set; and
        reconstruct the event data into an image representation of the target volume with correction of cascade coincidence using the relationship between the annihilation coincidence events and the cascade coincidence events in the cascade data set and with scatter correction using the relationship between the primary coincidence events and the scattered coincidence events.

2. The nuclear imaging system according to claim 1, wherein the MC simulation technique fully determines the contribution of cascade coincidence events to the event data.

3. The nuclear imaging system according to claim 1, wherein the at least one processor is further programmed to:
    simulate cascade and annihilation gamma emissions from the target volume and coincidence detection of the nuclear imaging system using a method modeling the shape of the distribution of the cascade coincidence events in the event data;
    simulate various combinations of cascade and annihilation gammas emitted from the target volume using the MC simulation technique to determine a scaling factor for the shape of the distribution;
    scale the shape of the distribution by the scale factor to generate the cascade dataset.

4. The nuclear imaging system according to claim 3, wherein the method modeling shape is a single scatter simulation (SSS) technique.

5. The nuclear imaging system according to claim 3, wherein the method modeling shape models the shape of the distribution as the shape of the distribution of delayed coincident events in the event data.

6. The nuclear imaging system according to claim 1, wherein the at least one processor is further programmed to:
    simulate cascade gamma emissions using the MC simulation technique to determine the distribution of cascade and annihilation coincidence events; and
    reconstruct the received event data into the image representation using the distribution.

7. The nuclear imaging system according to claim 1, wherein the radionuclide is rubidium 82 ($^{82}$Rb), iodine 124 ($^{124}$I) or yttrium 86 ($^{86}$Y).

8. The nuclear imaging system according to claim 1, wherein the simulation of cascade gamma emissions is based an attenuation map of the target volume.

9. A nuclear imaging method accounting for cascade gammas, said nuclear imaging method comprising:
    receiving event data describing detected gamma rays emitted from a target volume of a subject, the detected gamma rays including cascade gammas emitted from a radionuclide within the target volume;
    simulating cascade and annihilation gamma emissions from the target volume and coincidence detection using a method modeling the shape of a distribution of cascade coincidence events in the event data;
    simulating various combinations of cascade and annihilation gammas emissions from the target volume and coincidence detection using a Monte Carlo (MC) simulation technique to determine a scaling factor for the shape of the distribution of the cascade coincidence events in the event data;
    scaling the shape of the distribution by the scale factor to generate the cascade dataset; and
    reconstructing the event data into an image representation of the target volume with correction of cascade coincidence using the cascade data set.

10. The nuclear imaging method according to claim 9, further including:
simulating scatter of annihilation gammas in the target volume to generate a scatter dataset comprised of primary coincidence events and scattered coincidence events; and
reconstructing the event data into the image representation with scatter correction using the relationship between the primary coincidence events and the scattered coincidence events.

11. The nuclear imaging method according to claim 9, wherein the method modeling the shape of the distribution of cascade coincidence events is a single scatter simulation (SSS) technique.

12. The nuclear imaging method according to claim 9, wherein the method modeling shape of the distribution of cascade coincidence events models the shape of the distribution as the shape of the distribution of delayed coincident events in the event data.

13. The nuclear imaging method according to claim 9, wherein the radionuclide is rubidium 82 ($^{82}$Rb), iodine 124 ($^{124}$I) or yttrium 86 ($^{86}$Y).

14. One or more processors programmed to perform the method according to claim 9.

15. A non-transitory computer readable medium carrying software which controls one or more processors to perform the method according to claim 9.

16. A nuclear imaging system accounting for cascade gammas, said nuclear imaging system comprising:
a simulation processor configured to:
simulate cascade and annihilation gamma emissions from a target volume of a subject and coincidence detection of the nuclear imaging system using a Monte Carlo (MC) simulation technique to generate a cascade dataset comprised of annihilation coincidence events and cascade coincidence events;
simulate scatter of annihilation gammas in the target volume to generate a scatter dataset comprised of primary coincidence events and scattered coincidence events; and
combine the scatter dataset and the cascade dataset to create a correction dataset; and
a reconstruction processor configured to reconstruct the event data into an image representation of the target volume using the correction dataset for correction of cascade gammas and scatter in the event data.

17. The nuclear imaging system according to claim 1, wherein:
the nuclear imaging system is a positron emission tomography (PET) system; and
the radionuclide is rubidium 82 ($^{82}$Rb).

* * * * *